(12) United States Patent
Boudreaux, Jr. et al.

(10) Patent No.: US 6,404,174 B1
(45) Date of Patent: Jun. 11, 2002

(54) CIRCUIT FOR IN-SYSTEM PROGRAMMING OF MEMORY DEVICE

(75) Inventors: Ralph R. Boudreaux, Jr.; Steven M. Robinson, both of Madison, AL (US); John S. McGary, Petersburg, TN (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 09/697,900

(22) Filed: Oct. 27, 2000

(51) Int. Cl.[7] .............................................. G05F 1/40
(52) U.S. Cl. ...................................... 323/273; 323/282
(58) Field of Search ................................ 323/273, 275, 323/280, 282, 285, 351

(56) References Cited

U.S. PATENT DOCUMENTS

| | | | |
|---|---|---|---|
| 4,327,319 A | 4/1982 | Swisher et al. | 323/303 |
| 4,594,648 A | 6/1986 | Gallios | 363/46 |
| 4,710,861 A | 12/1987 | Kanner | 363/46 |
| 4,873,602 A | 10/1989 | Wilkinson | 361/78 |
| 4,896,296 A | 1/1990 | Turner et al. | 365/189.08 |
| 5,083,078 A * | 1/1992 | Kubler et al. | 323/268 |
| 5,473,758 A | 12/1995 | Allen et al. | 395/430 |
| 5,661,685 A | 8/1997 | Lee et al. | 365/185.22 |
| 5,668,464 A | 9/1997 | Krein et al. | 323/259 |
| 5,686,844 A | 11/1997 | Hull et al. | 326/38 |
| 5,740,241 A | 4/1998 | Koenig et al. | 379/399 |
| 5,790,469 A | 8/1998 | Wong | 365/226 |
| 5,889,392 A * | 3/1999 | Moore et al. | 323/282 |
| 6,021,447 A | 2/2000 | Szeto et al. | 710/8 |
| 6,026,126 A | 2/2000 | Gaetano | 375/296 |
| 6,130,529 A * | 10/2000 | Andres et al. | 323/303 |
| 6,208,127 B1 * | 3/2001 | Doluca | 323/349 |
| 6,229,289 B1 * | 5/2001 | Piovaccari et al. | 323/268 |

* cited by examiner

*Primary Examiner*—Adolf Deneke Berhane
(74) *Attorney, Agent, or Firm*—Allen, Dyer, Doppelt, Milbrath & Gilchrist, P.A.

(57) ABSTRACT

A programming circuit is coupled to an input/output pin of a device and is operative to generate a selected one of a plurality of electrical stimuli, such as a programming voltage, high and low logic levels, and a high impedance output, to the device in selected electrical state, without affecting normal device operation. The programming circuit includes a switchmode power converter, a linear regulator, and a control circuit. The programming voltage is generated by the switchmode power converter only when required for programming the device. The linear regulator includes a transistor having its collector-emitter path coupled in circuit with the switchmode converter and an output node, as well as to a voltage divider network. The voltage divider network is coupled to the control input of a precision shunt regulator device, which supplies a base reference for the transistor to establish the value of a voltage to be applied provided from the output node to the device. The base of the linear regulator's transistor is also controllably coupled to ground through the collector-emitter path of a steering transistor of the control circuit. The regulator's output node is also controllably coupled to ground through the collector-emitter path of a steering transistor of the control circuit. The output node is coupled to a programming (I/O) pin of the device.

12 Claims, 1 Drawing Sheet

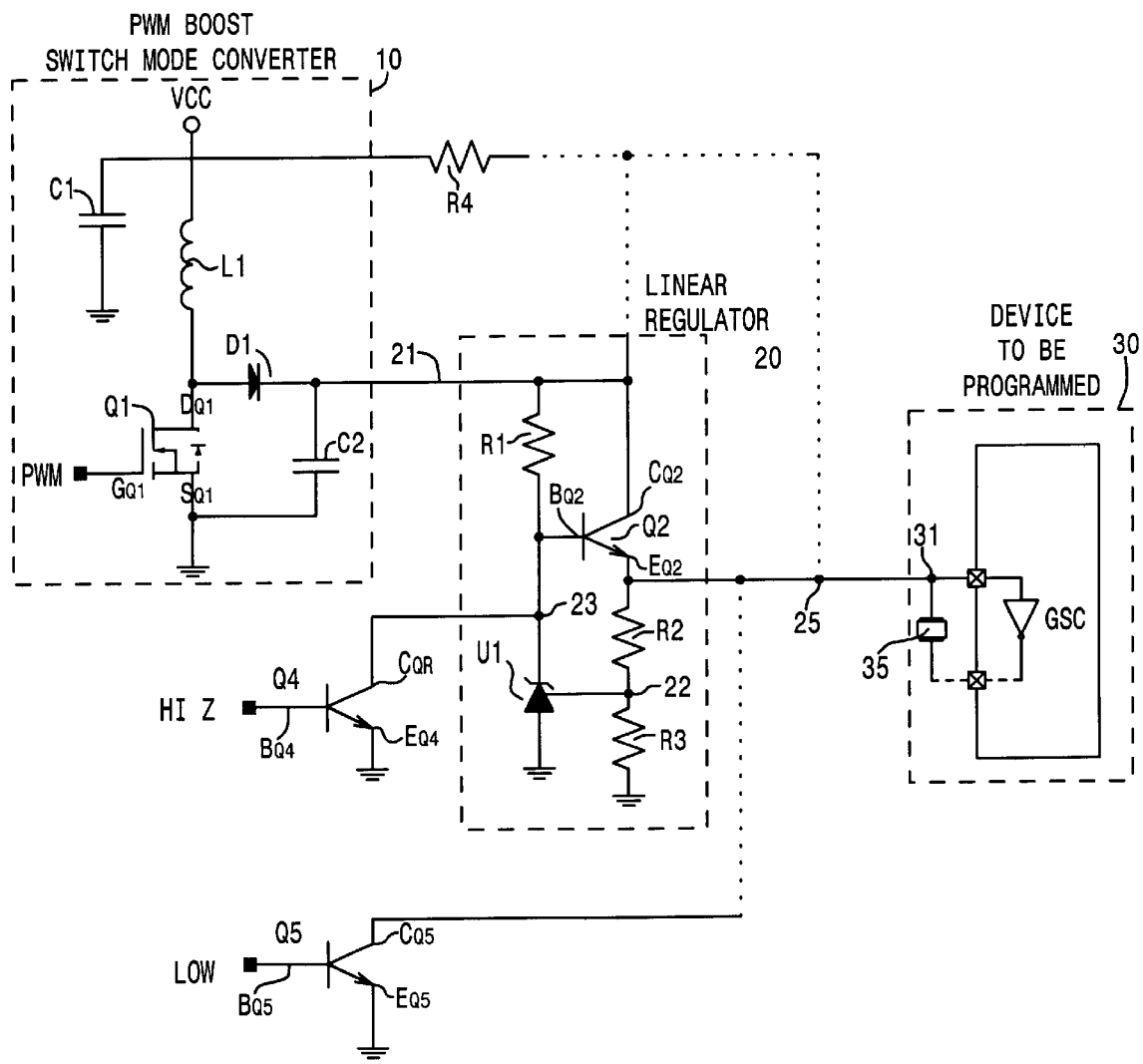

CIRCUIT FOR IN-SYSTEM PROGRAMMING OF MEMORY DEVICE

FIELD OF THE INVENTION

The present invention relates in general to communication and signal processing systems and components therefor, and is particularly directed to an external programming circuit that is adapted to be coupled to an input/output pin shared by a programmable device, such as memory device, with other system functions, and is operative to controllably generate an electrical stimulus including a programming voltage, respective high and low logic levels, and a high impedance state, and thereby place the memory device in a selected one of a plurality electrical states, without affecting normal device operation.

BACKGROUND OF THE INVENTION

A wide variety of electronic devices commonly contain a microprocessor or microcontroller having internal and/or external memory. Current memory device implementations are typically non-volatile devices, such as electrically erasable programmable read only memory (EEPROM) devices, which can be programmed or reprogrammed by the application of an electrical stimulus (in contrast with older EPROM devices that required the application of high intensity ultraviolet light through a quartz window in the package containing the memory chip).

The electrical stimulus that is used to program an EEPROM is customarily generated using an in-system programming (ISP) mode, in which an elevated voltage that exceeds the typical operating voltage of the device is coupled to one or more of the device interface pins, while data is applied to the device through other pins. ISP mode has advantages over traditional programming schemes in all stages of memory life including product development, manufacturing and customer service. A principal advantage of ISP mode is the ability to program or reprogram the device without removing (e.g., unsoldering) the memory device from its circuit board.

However, interfacing ISP mode signals from the system in which the memory device is installed is a non-trivial function, since the one or more pins used for programming such (EEPROM) memory devices are also shared with other (input/output (I/O) functions, such coupling to an external clock oscillator's quartz crystal element), in order to constrain package size. In addition to driving a shared programming pin with a high programming voltage during a typical programming operation, it may also be necessary to drive the pin with a high logic level, a low logic level, and a high impedance state. This has conventionally been accomplished by using a dedicated programming voltage that is switched into the device by an analog switch or the like.

SUMMARY OF THE INVENTION

In accordance with the present invention, the desire to perform in-system programming and/or driving of a device, such as an EEPROM, with differentially valued stimuli, without affecting normal device operation and without the need for complicated and expensive programming hardware, is successfully addressed by a new and improved, relatively inexpensive programming circuit architecture, which is controllably operative to generate a programming voltage only when necessary, while also being capable of selectively supplying each of high and low logic levels, as well as driving the device to a high impedance state.

For this purpose, the selective programming circuit architecture of the present invention comprises a switchmode power converter, a linear regulator, and an associated set of steering transistors, coupled in circuit with high and low voltage supply terminals and an output node, which outputs an electrical stimulus for externally establishing the electrical state of a programmable device. As will be described, the switchmode power converter may be configured as a pulse width modulated (PWM) power boost converter, which may comprise the power stage of a PWM boost DC—DC converter, and is used to generate the required programming voltage, which exceeds the typical operating voltage of the device. The programming voltage is generated by the PWM boost converter only when required for programming the device.

The PWM boost converter includes a controlled switching device such as a field effect transistor (FET), having its source-drain path coupled in circuit with an inductor between respective power supply terminals. A rectifier is coupled between the inductor and an electrical stimulus coupling path to the linear regulator. An energy storage capacitor is coupled between the stimulus coupling path and ground, and is used to store energy supplied from the power source and the inductor, when the PWM boost circuit's FET is in the OFF state. When the FET is in the ON state, electrical energy is stored in the inductor.

The linear regulator includes a transistor having its collector-emitter path coupled between the stimulus coupling path from the PWM boost converter and the output node, as well as to a voltage divider network that is coupled to the control input of a precision shunt regulator device which, in turn, is coupled to the base of the transistor to establish the value of a programming voltage to be selectively applied from the output node to the device. The base of the linear regulator transistor is controllably coupled to ground through the collector-emitter path of a second (or 'high') transistor. This second transistor enables the high impedance state and logic high level state. The linear regulator's output node is controllably coupled to ground through the collector-emitter path of a third (or 'low') transistor. This third transistor enables the logic low level state. The output node is coupled to a programming (I/O) pin of the device.

To generate the programming voltage, the high and low transistors are turned OFF, while a PWM signal is supplied to the PWM FET. The boost voltage will therefore be coupled through the linear regulator transistor to the output node. To generate a high logic level voltage, both high and low steering transistors are turned OFF, as in the programming mode. In addition, the PWM FET is turned OFF. As a result, a DC coupling path is provided to the output node from the supply terminal VCC through the PWM converter and the linear regulator transistor. The voltage supplied by the output node to a device I/O pin is therefore equal to the supply voltage VCC minus the voltage drops of the PWM converter's diode and the base-emitter junction of the linear regulator transistor.

If this slightly reduced voltage is not sufficient to provide the desired high logic level voltage at the output node, an optional resistor may be connected in a manner to compensate for either or both of the voltage drops. The linear regulator may be also be augmented to regulate the logic high voltage level at a precise value, by coupling the boosted voltage to the collector of the regulator's transistor for both the programming mode and logic high level mode. This may be readily accomplished by connecting a series resistor and auxiliary transistor in parallel with one of resistors of the voltage dividing network, and thus forcing the set point of the linear regulator to either the logic high level voltage or the higher programming voltage.

To generate a low logic level voltage, both of the high and low steering transistors are turned ON, while the PWM converter's FET is turned OFF. With the high steering transistor turned ON, its collector-emitter path provides ground potential to the linear regulator's base transistor, causing the regulator transistor to be by-passed, so as to interrupt the DC coupling path from the output node from the VCC supply. Additionally, with the low steering transistor turned ON, the output node is directly coupled to ground through the collector-emitter path of the low steering transistor.

In order to place the output node in a high impedance state, the PWM regulator's switching FET and the low steering transistor are turned OFF, while the high steering transistor is turned ON. Since the high steering transistor is turned ON, the base-emitter junction of the linear regulator's transistor will be off, or slightly reverse biased, so that the output node will see only the impedance provided by the voltage divider network and the reverse biased base-emitter junction of the regulator transistor.

BRIEF DESCRIPTION OF THE DRAWINGS

The single FIGURE is a circuit schematic of the selective programming circuit of the present invention.

DETAILED DESCRIPTION

The overall architecture of the selective programming circuit of the present invention is schematically shown in the single FIGURE as comprising an interconnected arrangement of a switchmode converter 10, a linear regulator 20, and an associated set of steering devices, shown as transistors Q4 and Q5 of a control circuit, that are installed in circuit with voltage supply terminals (e.g., VCC and ground) and an output node 25, from which a stimulus for externally establishing the electrical state of a programmable device 30 is supplied. Although transistors Q4 and Q5, as well as a transistor Q2, are illustrated as bipolar (here, NPN) devices, it is to be understood that the invention is not limited thereto, but that other alternative equivalent devices, such as field effect transistors (FETs) may be employed in lieu thereof. In a complementary fashion, the FET Q1 may be replaced by an alternative equivalent device, such as a bipolar transistor. The components shown in the FIGURE provide a practical implementation of their associated functions, to be described.

The switchmode converter 10 is configured as the power stage of a classic PWM boost DC—DC converter, and is operative to generate an 'elevated' or 'boosted' voltage as a programming voltage. As mentioned earlier, an 'elevated' or programming voltage is a voltage that is higher than or exceeds the typical operating voltage (e.g., supply voltage, VCC) of the device 30. For this purpose, the switchmode or PWM boost converter 10 includes a controlled switching device Q1, shown as a FET, having its source $S_{Q1}$ coupled to a reference potential terminal (e.g., ground (GND) ), and its drain $D_{Q1}$ coupled in circuit with an inductor L1, which is coupled to a voltage supply terminal to which a VCC supply rail is coupled. During the programming voltage boost mode, the gate $G_{Q1}$ of the FET Q1 is coupled to receive a standard PWM drive signal, or a fraction thereof at a relatively fixed duty cycle, such as that provided by way of a system clock (not shown).

The PWM boost circuit further includes a capacitor C1 coupled between the supply terminal VCC and ground, and a rectifier (diode) D1 coupled in circuit between the drain $D_{Q1}$ of the FET Q1 and an electrical stimulus coupling input path 21 to the linear regulator 20. In addition, an energy storage capacitor C2 is coupled between the stimulus coupling path 21 and ground. Capacitor C2 is used to store energy supplied from the (VCC) power source and the inductor L1, when the FET Q1 is in the OFF state. When the FET Q1 is in the ON state, electrical energy is stored in the inductor L1. Because the PWM boost: converter 10 as shown lacks closed loop feedback, it does not provide tight regulation of its output voltage applied to path 21 under varying load conditions. As a consequence, path 21 is coupled to the linear regulator 20, which serves to precisely regulate the generally unregulated voltage produced by the PWM boost converter 10 at the required programming voltage.

For this, purpose, the linear regulator 20 includes a (bipolar) transistor Q2 having its collector $C_{Q2}$ coupled to the voltage stimulus coupling path 21 from the PWM boost converter 10 and its emitter $E_{Q2}$ coupled to the output node 25 and to a grounded voltage divider network containing resistors R2 and R3. This voltage divider network has a node 22 coupled to the feedback control input of a precision shunt regulator device U1, the anode of which is grounded, in order to establish the value of a programming voltage to be selectively applied to node 25 and thereby to the device 30.

The base $B_{Q2}$ of the transistor Q2 is coupled to a node 23 between a resistor R1, which is coupled to the regulator's input path 21, and the cathode of the precision shunt regulator device U1. Node 23 is further coupled to the collector $C_{Q4}$ of steering transistor Q4, the emitter $E_{Q4}$ of which is grounded. The base $B_{Q4}$ of steering transistor Q4 is coupled to receive a 'high', control signal (HI).

The linear regulator's output node 25 is coupled to the collector $C_{Q5}$, of a 'LOW' steering transistor Q5, the emitter $E_{Q5}$ of which is grounded and the base $B_{Q5}$ of which is coupled to receive a 'low' control signal (LOW). A resistor R4 may be optionally coupled between the supply voltage VCC to the output node 25 or input supply path 21. The output node 25 is coupled to a programming (I/O) pin 31 of the device 30 to be programmed which, for purposes of providing a non-limiting example, is shown as sharing its programming pin with a crystal oscillator 35.

As described briefly above, the selective programming circuit of the present invention is capable of selectively providing to its output node 25 any one of a plurality of electrical stimuli, including a programming voltage, respective high and low logic levels, and a high impedance state. The programming voltage provided by the PWM boost converter 10 is generated only when required for programming the device 30. To generate such a programming voltage, the respective base input control voltages (HI) and (LOW) applied to each of the steering transistors Q4 and Q5 are defined, so as to keep these transistors turned OFF, while a PWM signal is supplied to the gate $G_{Q1}$ of the FET Q1. Since the 'high', or HI, steering transistor Q4 is turned OFF, the transistor Q2 will be operating in the active region controlled by regulator U1, so as to provide a programming voltage coupling path therethrough to the output node 25. The required programming voltage derived from the energy stored in the energy storage capacitor C2 is thereby supplied by the output node 25 to the device 30 to be programmed.

To generate a high logic level voltage, steering transistors Q4 and Q5 are turned OFF, as in the programming mode, described above. In addition, the gate $G_{Q1}$ of FET Q1 is applied with a turn off voltage, so that each of transistors Q1, Q2 and Q3 is turned OFF. A DC coupling path is now coupled to the output node 25 from the supply terminal VCC, inductor L1, diode D1, resistor R1 and the base-emitter and collector-emitter junctions of transistor Q2. The voltage supplied by the output node 25 to device pin 31 is therefore approximately equal to the supply voltage VCC minus the voltage drops of diode D1 and the base-emitter junction $Vbe_{Q2}$ of transistor Q2.

Should this slightly reduced (below VCC) voltage be insufficient to provide the desired 'high' logic level voltage at node 25, then the optional connection of resistor R4 may be provided. Connecting resistor R4 to the emitter $E_{Q2}$ of transistor Q2 will compensate for both of these voltage drops; however, such a connection may load the I/O pin 31 during normal operation. To avoid loading the I/O pin, the resistor R4 may be connected to the collector $C_{Q2}$ or base $B_{Q2}$ of transistor Q2, but it will compensate for only the voltage drop of diode D1. In addition, adding the resistor R4 will slightly decrease the efficiency of the boost circuit.

The circuitry of the linear regulator 20 which is principally used to regulate the programming voltage may be augmented to regulate the logic high voltage level at a precise value. For this purpose, a higher voltage is coupled to the collector $C_{Q2}$ of the transistor Q2 for both the programming mode and high logic level mode. This may be readily accomplished by connecting a series resistor and auxiliary transistor in parallel with one of resistors R2 and R3, and then adjusting the set point of the linear regulator 20 to select between the two voltages (the logic high level voltage, and the even higher programming voltage). To save power when regulating the logic high voltage, the boosted voltage can be reduced by adjusting the PWM signal.

To generate a low logic level voltage, both of the steering transistors Q4 and Q5 are turned ON, while the PWM converter's FET Q1 is turned OFF. Since the HI steering transistor Q4 is now asserted ON, the transistor Q2 will be by-passed, so as to interrupt the DC coupling path to the output node 25 from the VCC supply. In addition, with the LOW steering transistor Q5 turned ON, output node 25 is coupled through the collector-emitter path of transistor Q5 to ground (LOW logic level voltage).

In order to place the output node 25 in a high impedance state, the PWM regulator's switching FET Q1 and the LOW steering transistor Q5 are turned OFF, while the HI steering transistor Q4 is turned ON. Since the HI steering transistor Q4 is now asserted ON, the base-emitter junction of transistor Q2 will be reverse biased (depending upon the voltage impressed upon the I/O pin 31 by the device 30 or other circuitry). Namely, when set to the high impedance state, the output node 25 sees only the impedance provided by the resistors R2 and R3 and the reverse biased base-emitter junction of the transistor Q2.

If the device 30 can tolerate the wider voltage range of the open loop PWM boost converter 10, or if the PWM boost converter 10 is regulated by closed loop feedback control, then the resistors R2 and R3 and precision shunt regulator device U1 of the linear regulator 20 can be removed. The transistor Q2 and resistor R1 are retained in the coupling path with steering transistor Q4, which is still used to place node 25 in the high impedance state. In addition, if the host system is capable of providing the required elevated voltage level of the programming voltage, then the boost converter 10 may be dispensed with. Still, the transistor Q2 and resistor R1 of the regulator 20 are retained in the voltage coupling path with steering transistor Q4, which is still used to place output node 25 is the high impedance state. Also, the entirety of the linear regulator 20 may be used to precisely regulate the host system voltage, if necessary.

While we have shown and described an embodiment in accordance with the present invention, it is to be understood that the same is not limited thereto but is susceptible to changes and modifications as known to a person skilled in the art. We therefore do not wish to be limited to the details shown and described herein, but intend to cover all such changes and modifications as are obvious to one of ordinary skill in the art.

What is claimed is:

1. A circuit for generating a programming voltage to be applied to an electronic circuit device comprising:

an output node to which said programming voltage is coupled for application to said electronic circuit device;

a switchmode power converter having a clock-controlled switching device coupled in circuit with a supply voltage and an auxiliary energy storage circuit, and having a drive terminal coupled to receive a clock signal, said switchmode power converter being operative, in response to application of said clock signal to said drive terminal, to controllably generate a programming voltage that exceeds a normal operating voltage of said electronic circuit device; and a voltage regulator, coupled in circuit with said switchmode power converter and said output node, and being operative to regulate said programming voltage for application to said output node and thereby to said electronic circuit device.

2. The circuit according to claim 1, further including a control circuit, coupled with and being controllably operative to control the operation of said switchmode power converter and said voltage regulator, so as to cause a selected one of a plurality of different voltages to be provided at said output node for application to said electronic circuit device, and thereby place said electronic circuit device in a selected one of a plurality electrical states.

3. The circuit according to claim 2, wherein said control circuit is controllably operative to control the operation of said switchmode power converter and said voltage regulator, so as to selectively present a selected one of respective high and low logic level voltages and a high impedance to said output node for application to said electronic circuit device.

4. The circuit according to claim 3, wherein, for the case of presenting said high logic level voltage to said output node, said control circuit is controllably operative to selectively cause said high logic level voltage from said switchmode power converter to be coupled through said voltage regulator to said output node.

5. The circuit according to claim 4, further including an auxiliary voltage coupling circuit, coupled with a high logic level voltage coupling path from said supply voltage to said output node, and being operative to compensate for one or more voltage drops from said supply voltage through said switchmode power converter and said voltage regulator to said output node.

6. The circuit according to claim 4, wherein said voltage regulator is configured to provide different regulator set points for said programming voltage and said high logic level voltage.

7. The circuit according to claim 3, wherein said voltage regulator includes a controlled output circuit, coupled in circuit with said switchmode power converter and said output node and wherein, for the case of presenting said high impedance to said output node, said control circuit is controllably operative to selectively place said controlled output circuit in a high impedance state.

8. The circuit according to claim 2, wherein said control circuit is controllably operative to control the operation of said switchmode power converter and said voltage regulator, so as to cause said output node to selectively provide said programming voltage as generated by said switchmode power converter and regulated by said voltage regulator.

9. The circuit according to claim 3, wherein, for the case of presenting said low logic level voltage to said output node, said control circuit is controllably operative to selectively prevent said high logic level voltage from said switchmode power converter from being coupled through said voltage regulator to said output node.

10. A method of generating a programming voltage for application to an electronic circuit device comprising the steps of:

(a) providing a switchmode power converter having a clock-controlled switching device coupled in circuit with a supply, voltage and an auxiliary energy storage circuit, and having a drive terminal that is adapted to receive a clock signal, said switchmode power converter being operative, in response to application of said clock signal to said drive terminal, to controllably generate a programming voltage that exceeds a normal operating voltage of said electronic circuit device;

(b) coupling a voltage regulator with said switchmode power converter and said output node, said voltage regulator being operative to regulate said programming voltage for application to said output node and thereby to said electronic circuit device; and (c) applying said clock signal to said drive terminal and thereby causing said switchmode power converter to controllably generate said programming voltage that exceeds said normal operating voltage of said electronic circuit device.

11. The method according to claim 10, further including the step (d) of controlling the operation of said switchmode power converter and said voltage regulator, so as to selectively present a selected one of said programming voltage, respective high and low logic level voltages and a high impedance to said output.

12. The method according to claim 10, wherein said clock signal has a fixed duty cycle.

* * * * *